(12) United States Patent
Lim

(10) Patent No.: US 7,670,864 B2
(45) Date of Patent: Mar. 2, 2010

(54) CMOS IMAGE SENSOR AND FABRICATING METHOD THEREOF

(75) Inventor: Keun-Hyuk Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 137 days.

(21) Appl. No.: 11/963,433

(22) Filed: Dec. 21, 2007

(65) Prior Publication Data

US 2008/0157147 A1    Jul. 3, 2008

(30) Foreign Application Priority Data

Dec. 29, 2006    (KR) .................. 10-2006-0137559

(51) Int. Cl.
*H01L 51/40* (2006.01)

(52) U.S. Cl. ................. 438/57; 257/292; 257/E27.132; 257/E27.133; 438/59

(58) Field of Classification Search ................. 257/233, 257/292, 355–363, 369, E27.132, E27.133, 257/E27.15; 438/57, 59

See application file for complete search history.

(56) References Cited

U.S. PATENT DOCUMENTS 6,979,587 B2 * 12/2005 Lee ............................... 438/57
2005/0051701 A1 * 3/2005 Hong ....................... 250/214.1

* cited by examiner

*Primary Examiner*—Matthew C Landau
*Assistant Examiner*—Lindsay Wickers
(74) *Attorney, Agent, or Firm*—Sherr & Vaughn, PLLC

(57) ABSTRACT

A CMOS image sensor and method of manufacture reduces the problem of electron loss in a floating diffusion area. A method of fabricating a CMOS image sensor includes forming a gate electrode over a first conductive type semiconductor substrate. A second conductive type first diffusion layer is formed within the semiconductor substrate to be aligned with an edge of one side of the gate electrode. A spacer may be attached to both sidewalls of the gate electrode. A first conductive type second diffusion layer may be formed within the first diffusion layer to leave a distance amounting to a width of the spacer in-between. A second conductive type third diffusion layer may be formed within the semiconductor substrate to be aligned with an edge of the other side of the gate electrode. A first conductive type fourth diffusion layer may be formed over the third diffusion layer, and a first conductive type fifth diffusion layer may be formed under the third diffusion layer.

11 Claims, 2 Drawing Sheets

CMOS IMAGE SENSOR AND FABRICATING METHOD THEREOF

The present application claims priority under 35 U.S.C. 119 to Korean Patent Application No. 10-2006-0137559, filed on Dec. 29, 2006, which is hereby incorporated by reference in its entirety.

BACKGROUND

A CMOS image sensor uses MOS transistors as light sensitive pixels according to CMOS technology design rules. Around the periphery of the light sensitive region, the sensor integrates a control circuit and a signal processing circuit to sequentially detect outputs using the MOS transistors. A CMOS image sensor is therefore more conveniently driven in various scanning modes. Since a signal processing circuit can be integrated on a single chip in the CMOS image sensor, end products may be made smaller and less expensive, owing to the compatibility of the CMOS technology. Moreover, since power consumption of the CMOS image sensor is considerably smaller than that of a CCD, the CMOS image sensor may be used in more products.

Figure 1:
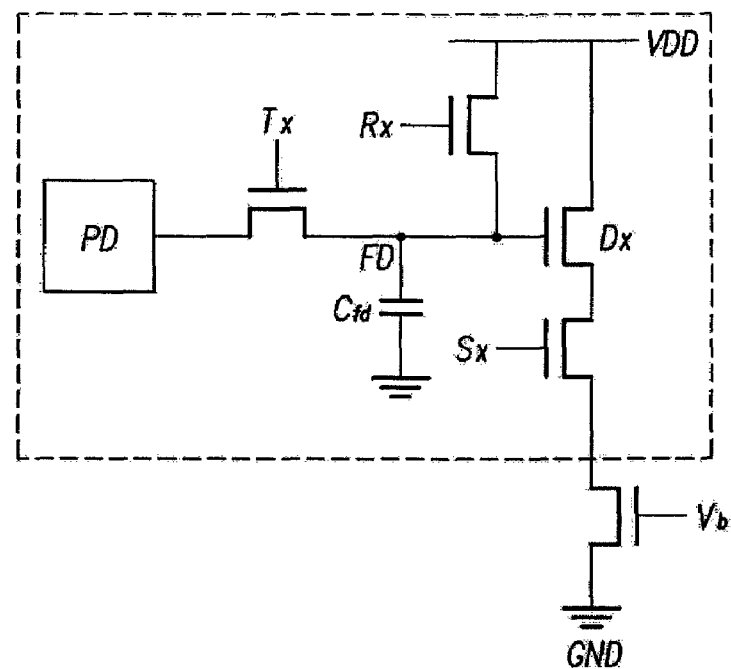

FIG. 1 is a circuit diagram of a unit pixel of a 4-T CMOS image sensor. Referring to FIG. 1, a unit pixel of a 4-T CMOS image sensor includes a photodiode (PD) as a photosensing means and four NMOS transistors $T_x$, $R_x$, $D_x$, and $S_x$. The transfer transistor $T_x$ delivers photo generated charges from the photodiode (PD) to a floating sensing node. The reset transistor $R_x$ discharges charges stored in the floating sensing node for signal detection. The drive transistor $D_x$ plays a role as a source follower. The select transistor Sx is provided for switching and addressing. A DC gate is a load transistor enabling a constant current to flow by applying a constant voltage as a gate potential of transistor. '$V_{DD}$' indicates a drive power source voltage and '$V_{SS}$' or "GND" indicates a ground voltage.

In a 4T CMOS image sensor, as the gate electrode of the transfer transistor $T_x$ is turned on, electrons generated by the photodiode PD migrate into a floating diffusion (FD) area. In the floating diffusion area (FD), electrons migrating from the photodiode are transformed into a voltage using a source follower transistor. So, photo-energy is delivered as a voltage signal. In doing so, the floating diffusion area (FD) works as a sort of a capacitor. If the electrons are lost by leakage from the floating diffusion area (FD), the device is unable to deliver an accurate voltage. Hence, device performance is degraded.

SUMMARY

Embodiments relate to a CMOS image sensor and method of manufacture in which the problem of electron loss in a floating diffusion area can be reduced. Embodiments relate to a CMOS image sensor with an configuration of a floating diffusion area is enhanced.

Embodiments relate to a method of fabricating a CMOS image sensor by forming a gate electrode over a first conductive type semiconductor substrate. A second conductive type first diffusion layer is formed within the semiconductor substrate to be aligned with an edge of one side of the gate electrode. A spacer may be attached to both sidewalls of the gate electrode. A first conductive type second diffusion layer may be formed within the first diffusion layer to leave a distance amounting to a width of the spacer in-between. A second conductive type third diffusion layer may be formed within the semiconductor substrate to be aligned with an edge of the other side of the gate electrode. A first conductive type fourth diffusion layer may be formed over the third diffusion layer, and a first conductive type fifth diffusion layer may be formed under the third diffusion layer.

In embodiments, after forming the third diffusion layer, a contact may be formed for the third diffusion layer. In embodiments, the contact is configured to extend to the third diffusion layer via the fourth diffusion layer. In embodiments, the third diffusion layer is more heavily doped than the first diffusion layer. In embodiments, each of the fourth and fifth diffusion layers may be formed at a dose of approximately $10^{14}$~$10^{16}$ ions/cm$^2$. In embodiments, each of the fourth and fifth diffusion layers is formed by selective ion implantation carried out on the upper part of the third diffusion layer using a photomask.

Embodiments relate to a CMOS image sensor which includes a first conductive type semiconductor substrate. A second conductive type first diffusion layer may be formed within the semiconductor substrate. A gate electrode may be formed over the semiconductor substrate, the gate electrode having an edge of one side aligned with that of one side of the first diffusion layer. A spacer may be formed over both sidewalls of the gate electrode. A first conductive type second diffusion layer may be formed within the first diffusion layer in the vicinity of a surface of the semiconductor substrate to be spaced apart as wide as a width of the spacer. A floating diffusion area may be formed comprising a plurality of diffusion layers stacked within the semiconductor substrate to be aligned with an edge of the other side of the gate electrode.

In embodiments, the CMOS image sensor further includes a contact connected to the third diffusion layer via the fourth diffusion layer. In embodiments, the floating diffusion area includes a second conductive type third diffusion layer within the semiconductor substrate to be aligned with an edge of the other side of the gate electrode, a first conductive type fourth diffusion layer over a surface of an upper part of the third diffusion layer, and a first conductive type fifth diffusion layer over an interface contacting with the semiconductor substrate under the third diffusion layer.

DRAWINGS

FIG. 1 is a circuit diagram of a unit pixel of a related 4-T CMOS image sensor.

Figure 2A:
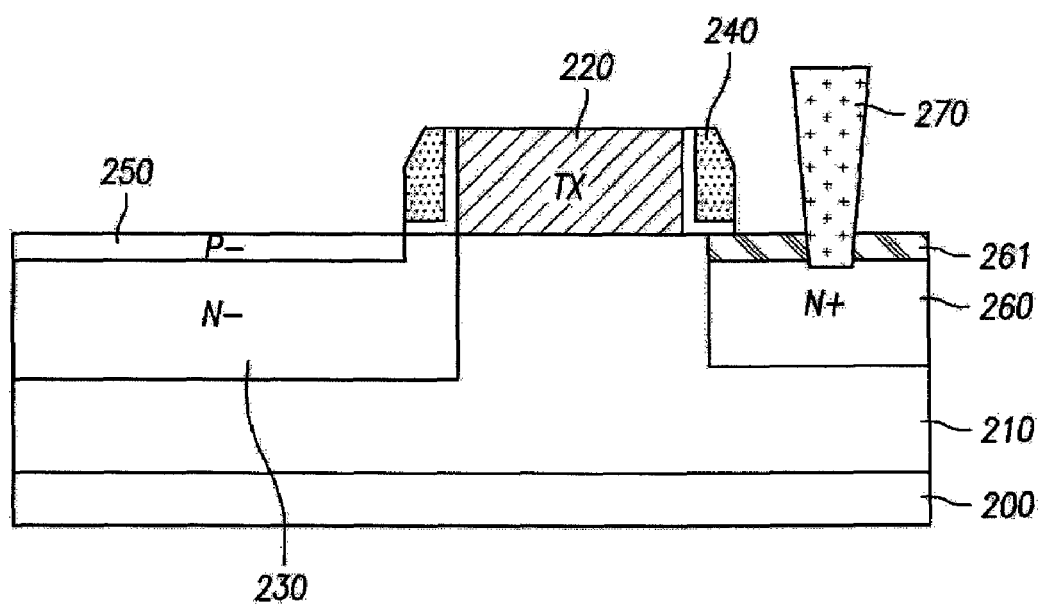
Figure 2B:
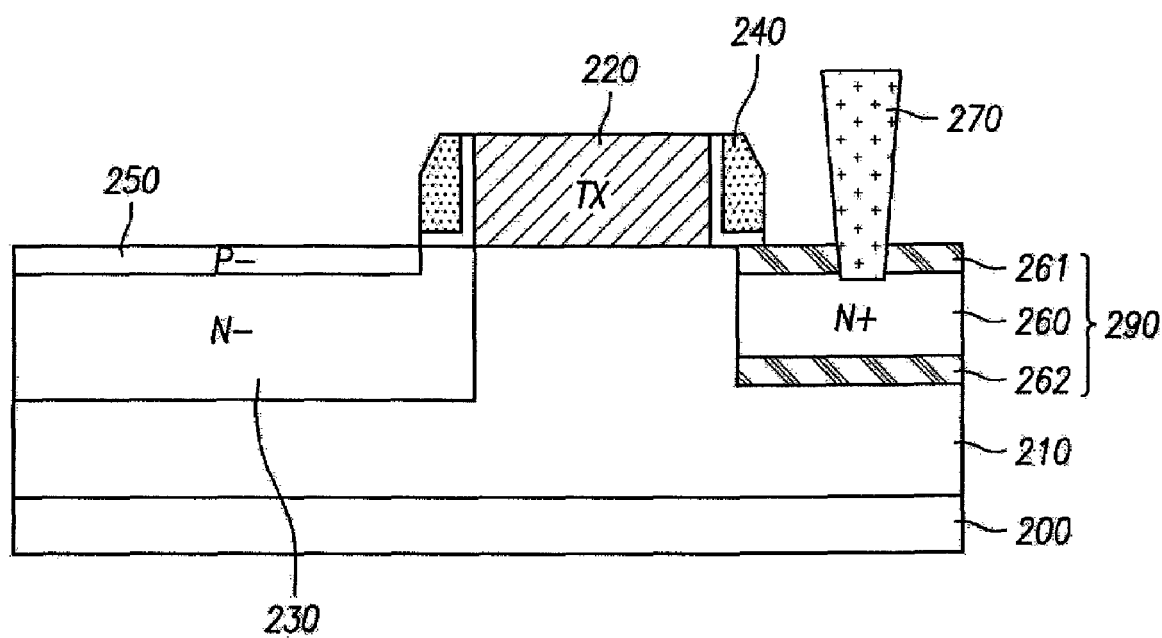

Example FIG. 2A and example FIG. 2B are cross-sectional diagrams for a method of fabricating a CMOS image sensor according to embodiments.

DESCRIPTION

Example FIG. 2A and example FIG. 2B schematically show a gate electrode of a transfer transistor $T_x$, a photodiode area, and a floating diffusion area. In particular, a reset transistor ($R_x$), a drive transistor ($D_x$) and a select transistor ($S_x$) can be simultaneously provided.

Referring to example FIG. 2A, a lightly doped p− epitaxial layer 210 is grown over a heavily doped p+ substrate 200. A device isolation layer for inter-unit-pixel isolation may be formed at a prescribed portion of the p− epitaxial layer 210 by LOCOS (local oxidation of silicon) or STI (shallow trench isolation). Subsequently, a transfer transistor ($T_x$) gate electrode (hereinafter abbreviated gate electrode 220) is formed over the p− epitaxial layer 210.

A deep n− diffusion layer 230 is formed by implanting n type impurities (n−) lightly with high energy into a portion of the p− epitaxial layer 210 next to one side of the gate electrode 220. In forming the n− diffusion layer 230, an n− VLDD (very lightly doped drain) region may be simultaneously formed which will become a floating diffusion area (FD) to be aligned with the other side of the gate electrode 220.

After a spacer insulating layer has been deposited over the above-configured structure, a blank etch process is carried out on the insulating layer to form a spacer 240 attached to sidewalls of the gate electrode 220. A P° diffusion layer 250 is formed in the vicinity of a surface of the p–epitaxial layer 210 and on the n– diffusion layer 230 by blanket ion implantation for injecting p type impurities with low energy. In this case, the P° diffusion layer 250 formed within the n– diffusion layer 230 is spaced apart to the thickness of the spacer 240.

Through the p type ion implantation, a shallow pn junction including the p° diffusion layer 250 and the n– diffusion layer 230 is formed. A pnp diode including the p-epitaxial layer 210, the n– diffusion layer 230 and the p° diffusion layer 250 is formed. To form a floating diffusion area (FD), an n+ diffusion layer 260 is formed by heavily implanting n type impurities (n+) into the p–epitaxial layer 210 next to the other side of the gate electrode 220. In the drawing, the n+ diffusion layer 260 forming the floating diffusion area (FD) is schematically shown. Yet, the floating diffusion area (FD) can include the aforesaid n– VLDD and the n+ diffusion layer 260.

A first p+ diffusion layer 261 may be formed by selectively and heavily implanting p type impurity ions (p+) into an upper part of the n+ diffusion layer 260 for the floating diffusion area (FD) using a photomask. Electron leakage to the surface of the substrate 200 from the n+ diffusion layer 260 may be reduced by isolating the floating diffusion area (FD) from a surface of the substrate 200. A dose of the heavily implanted p type impurities (p+) may be set to approximately $10^{14} \sim 10^{16}$ ions/cm² similar to that of the heavily implanted n type impurities (n+).

A contact 270 can be provided to the first p+ diffusion layer 261. In embodiments, the contact 270 is connected to the n+ diffusion layer 260 through the first P+ diffusion layer 261.

Referring to example FIG. 2B, p type impurities (p+) are heavily implanted into a lower part of the n+ diffusion layer 260 to form a second p+ diffusion layer 262. As mentioned above, the n+ diffusion layer 260 may be formed by heavy ion implantation of n type impurities (n+). The first and second p+ diffusion layers 261 and 262 may be formed at the upper and lower parts of the n+ diffusion layer 260, respectively. Thus, the floating diffusion area 290 includes the first p+ diffusion layer 261, the n+ diffusion layer 260, and the second p+ diffusion layer 262.

The floating diffusion area 290 may be further isolated by heavily implanting the p type impurities (p+) into the lower part of the n+ diffusion layer 260 as well as the upper part. In particular, prior to forming the floating diffusion area 290, after the first p type impurities (p+) have been implanted selectively and heavily using the photomask, n type impurities (n+) are heavily implanted on the first p type impurities (p+). Second p type impurities (p+) are again heavily implanted into the regions heavily doped with n type impurities (n+).

The electron leakage generated from the floating diffusion area (FD) is suppressed to enhance the transfer characteristics of the photodiode (PD). By minimizing electron leakage, imaging in low illumination conditions can be enhanced.

And, cap of the floating diffusion area is increased overall by performing ion implantation on the upper and lower parts of the floating diffusion area (FD), whereby noise characteristics can be improved.

Thus, substantially complete depletion is achieved in the n– diffusion layer 230. In the CMOS image sensor according to embodiments, charges may be transferred to the n+ diffusion layer 260 including the first and second p+ diffusion layers 261 and 262 from the n– diffusion layer 230 via the p° diffusion layer 250.

By isolating a floating diffusion area from a surface of a substrate with as much distance as possible, electron leakage generated from the floating diffusion area is substantially suppressed, enhancing the transfer characteristics of photodiode. In other words, by minimizing the electron leakage, imaging in low illumination conditions is enhanced. Also, ion implantation is carried out on upper and lower parts of a floating diffusion area to increase a cap of the floating diffusion area overall. Hence, noise characteristics can be enhanced.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a gate electrode over a first conductive type semiconductor substrate;
   forming a second conductive type first diffusion layer within the semiconductor substrate to be aligned with an edge of a first side of the gate electrode;
   forming a spacer attached to sidewalls of the gate electrode;
   forming a first conductive type second diffusion layer within the first diffusion layer spaced from the gate electrode by a width of the spacer;
   forming a second conductive type third diffusion layer within the semiconductor substrate aligned with an edge of a second side of the gate electrode; and
   forming a first conductive type fourth diffusion layer over the third diffusion layer and a first conductive type fifth diffusion layer under the third diffusion layer.

2. The method of claim 1, comprising forming a contact for the third diffusion layer after forming the third diffusion layer.

3. The method of claim 2, wherein the contact is configured to extend to the third diffusion layer via the fourth diffusion layer.

4. The method of claim 1, wherein the third diffusion layer is more heavily doped than the first diffusion layer.

5. The method of claim 1, wherein each of the fourth and fifth diffusion layers is formed at a dose of approximately $10^{14}$ to approximately $10^{16}$ ions/cm².

6. The method of claim 1, wherein each of the fourth and fifth diffusion layers is formed by selective ion implantation over the upper part of the third diffusion layer using a photomask.

7. The method of claim 1, whereby a transfer transistor is formed, comprising:
   forming a photodiode area on the substrate and connected to the transfer transistor;
   forming a floating diffusion area on the substrate and connected to the transfer transistor;
   forming a reset transistor on the substrate and connected to the transfer transistor; and
   forming a drive transistor on the substrate and connected to the transfer transistor, whereby a unit pixel of a CMOS image sensor is formed.

8. The method of claim 7, comprising:
   forming a select transistor on the substrate and connected to the drive transistor.

9. The method of claim 7, comprising:
   forming a device isolation film for inter-unit-pixel isolation.

10. The method of claim 7, wherein forming a second conductive type first diffusion layer within the semiconductor substrate to be aligned with an edge of a first side of the gate electrode is performed simultaneously with forming the floating diffusion layer.

11. The method of claim 1, wherein the first conductive type is a p-type, and the second conductive type is an n-type.

* * * * *